United States Patent

Borwn et al.

Patent Number: 5,119,043
Date of Patent: Jun. 2, 1992

[54] AUTO-CENTERED PHASE-LOCKED LOOP

[75] Inventors: Russell W. Borwn, Nepean, Canada; Michael D. Leis, Framingham; Elmer C. Simmons, Whitman, both of Mass.

[73] Assignee: Digital Equipment Corporation, Maynard, Mass.

[21] Appl. No.: 544,506

[22] Filed: Jun. 27, 1990

[51] Int. Cl.[5] .......................... H03L 7/093; H03L 7/10
[52] U.S. Cl. ............................................ 331/16; 331/17; 331/25
[58] Field of Search ................ 331/1 A, 10, 11, 14, 331/15, 16, 17, 18, 25

[56] References Cited

U.S. PATENT DOCUMENTS

| | | | |
|---|---|---|---|
| 4,107,624 | 8/1978 | Turner | 331/8 |
| 4,376,268 | 3/1983 | Moriya et al. | 331/10 |
| 4,494,080 | 1/1985 | Call | 331/8 |
| 4,568,888 | 2/1986 | Kimura et al. | 331/15 X |
| 4,593,254 | 6/1986 | Coburn | 331/1 A |
| 4,595,886 | 6/1986 | Mroch et al. | 331/1 A |
| 4,745,372 | 5/1988 | Miwa | 331/8 |
| 4,811,317 | 3/1989 | Barnard et al. | 369/32 |
| 4,829,545 | 5/1989 | Guzik et al. | 375/120 |

Primary Examiner—David Mis
Attorney, Agent, or Firm—Fish & Richardson

[57] ABSTRACT

A multi-band processing system for automatically tuning the oscillator of a phase-locked loop to the frequency and phase of an applied input. The system includes an error detection circuit, a frequency controller, a scaling circuit, and a phase and frequency controller. The applied input and the oscillator output are coupled to the error detection circuit whose error output drives a charge pump/filter circuit. An error signal is derived from the difference between the loop charge pump output $V_1$ and a preset charge pump zero error reference signal $V_{ref}$, wherein the frequency controller regulates the oscillator output frequency according to a frequency error component of $V_1 - V_{ref}$, the scaling circuit scales the oscillator output frequency according to a system scaling signal N, and the phase and frequency controller adjusts the oscillator output frequency and phase according to $V_1 - V_{ref}$ when a 1/N multiple of the frequency of the oscillator output is compared in the error detection circuit to the frequency of the applied input.

18 Claims, 2 Drawing Sheets

AUTO-CENTERED PHASE-LOCKED LOOP

BACKGROUND OF THE INVENTION

The present invention relates to a phase-locked loop in the frequency acquisition section of a computer system.

In writing data on a magnetic recording disk, spin rate and writing frequency, in part, determine the number (density) of cells (positions for recording information) which can be defined on a given track. Each cell represents a set of magnetic dipoles which can be magnetically oriented by a magnetic field from a recording head. Data is stored and retrieved based upon changes (or transitions) in dipole orientation from cell to cell to cell.

Generally, system storing and retrieving frequency (i.e., writing/reading frequency) is set to maximize cell density. In a system with a single frequency, the maximum cell density is limited by the capacity of the shortest (innermost) track on the disk. As a result, the longer outer tracks are under-utilized.

In a known industry approach to increasing disk cell density, each disk is segmented into concentric bands, each band containing a plurality of tracks. Each successive band from the center out is accorded a higher writing/reading frequency than the next prior band. This approach enables the defining of a greater number of cells in each successive band of longer tracks, and thus increases total disk cell density.

The head data signal generated when retrieving data from a medium is converted from analog to digital format and is then applied to a data separator circuit. A phase-locked loop circuit is conventionally used to extract a timing signal from the digital read signal. This timing signal is applied to the data separator to enable extraction of data from the digital read signal.

The timing signal output of the phase-locked loop is typically supplied by a voltage or current controlled oscillator, which is driven based upon frequency and phase differences between the oscillator output and the loop input. These differences are detected by an error detector circuit (e.g., a frequency/phase comparator) and cause a charge pump circuit to issue a control signal to a control input of the oscillator to effect frequency/phase adjustments to the oscillator output.

In operation of a multi-band system, the oscillator can be driven approximately to the band frequency of the data input signal it next expects to acquire by applying an appropriate control signal to the oscillator during the head in-transit period. Hence, hardware requirements are relaxed in view of the smaller frequency swing (if any) which later will be required to tune the oscillator to the actual frequency of the data input signal when it is received. This minimizes the voltage swing demanded of the charge pumps used to drive the oscillator. Consequently, if the oscillator is about at the frequency of the next expected data input frequency, then when the next expected data input signal is applied to the loop, the loop will be able to drive the oscillator quickly to the frequency/phase of that input.

SUMMARY OF THE INVENTION

The present invention provides a method and apparatus for efficiently acquiring any one of a set of band frequencies in a multi-band operating system. In general, the invention provides an arrangement for detecting frequency-related error in the output of an oscillator of a phase-locked loop, and based upon that error, driving the oscillator to reduce that error This arrangement is also responsive to significant jumps in the loop input frequency, such that occurs when bands are switched, which are accommodated by causing similar significant jumps in the oscillator frequency.

In one aspect of the present invention, a phaselocked loop includes an oscillator, a multi-input error detector circuit, and an oscillator drive circuit. The loop is switchable between various ones of a plurality of preset operating frequencies. Each one of the preset frequencies is represented with a respective scaling value and the present scaling value is represented as N. A 1/N multiplier circuit is coupled between the oscillator output and a first input of the error detector circuit, with the scaling value N being applied to the 1/N multiplier circuit, and with a 1/N multiple of the oscillator output frequency being supplied by the 1/N multiplier circuit to the error detector circuit as $(1/N)F_{vco}$. The error detector circuit has a second input for receiving a system input signal having a frequency $F_{in}$, with $(1/N)F_{vco}$ being compared in the error detector circuit to $F_{in}$. The error detector circuit generates an output $V_1$ representative of phase and/or frequency error between $F_{in}$ and $(1/N)F_{vco}$, where $V_1$ is equal to a fixed value $V_{ref}$ when there is no phase or frequency error between $F_{in}$ and $(1/N)F_{vco}$. The oscillator drive circuit includes an oscillator drive signal source circuit coupled to and for supplying a drive signal to an input of the oscillator, and a low pass filter/driver circuit for receiving $V_1$ and $V_{ref}$ and for detecting a low frequency error component, $V_{low}$, of $V_1$ When $V_1$ does not equal $V_{ref}$. $V_{low}$ represents the low frequency component error of the error between $F_{in}$ and $(1/N)F_{vco}$. The low pass filter/driver circuit outputs a control signal $V_2$ to an input of the oscillator drive signal source circuit for continuously adjusting the drive signal. This adjustment follows control signal Vz and serves for driving the oscillator until $(1/N)F_{vco}$ is at $F_{in}$ and $V_{low}$ is at zero.

Various embodiments of the invention may include any of the following features.

A band range select circuit, coupled to the low pass filter/driver circuit, may provide for scaling the control signal $V_2$ according to the scaling value N. The band range select circuit may include a binary gated switch. A phase and frequency control circuit may be provided which is responsive to the difference between $V_1$ and $V_{ref}$. This phase and frequency control circuit may be coupled between the output of the low pass filter/driver circuit and the oscillator input and serves to adjust the drive signal output of the oscillator drive signal source circuit before the drive signal is applied to the input of the oscillator. The thus adjusted drive signal thereby causes $(1/N)F_{vco}$ to be driven toward $F_{in}$ in magnitude and in phase. The phase and frequency control circuit may be a linearized multiplier circuit.

The filter/driver circuit may include an integrator circuit. The oscillator drive signal source circuit may include a voltage controlled current source circuit, wherein $V_1$ and $V_{ref}$ are applied to the integrator and the integrator output is applied to the oscillator drive signal source circuit. The integrator may include a resistive input for receipt of $V_1$ and a second input for receipt of $V_{ref}$, the integrator output being coupled to the integrator's resistive input via a capacitor, Wherein $(1/N)F_{vco}$ is held at $F_{in}$ by the charge on the capacitor when $V_1$ is equal to $V_{ref}$. The oscillator drive circuit may include a range multiplier circuit having a first input for receipt of the integrator output and a second input for receipt of the band range select output, wherein the integrator output is multiplied by the value of the band range select circuit output to generate control signal $V_2$. The oscillator drive circuit may also include a pair of voltage level shifting current mirrors wherein the output of the range multiplier circuit is coupled to the oscillator drive signal source via the current mirrors.

The multi-input error detector circuit may include a frequency comparator circuit, a phase and frequency comparator circuit, a multiplexer circuit and a charge pump/filter circuit, wherein the respective outputs of the comparators are selectively coupled to the charge pump/filter circuit via the multiplexer circuit. The multiplexer circuit may apply the output of the frequency comparator to the charge pump/filter circuit when the loop is switched from one to another of the plurality of preset frequencies. The oscillator may be a current controlled oscillator.

In another aspect of the present invention, a computer system having a magnetic recording disk having a phase-locked loop includes a current controlled oscillator, the loop being capable of acquiring one of a plurality of preset operating frequencies for use in a system (a) which represents each of the preset frequencies with a respective value of a scaling factor, the current value of the scaling factor being designated as N, and (b) which supplies a preset reference clock signal at a fixed frequency $F_{in}$ to the loop, the oscillator circuit having an output capable of being driven to a frequency $F_{vco}$ which is N times the frequency of $F_{in}$.

The system includes an error detector circuit for detecting the phase difference $\Delta_{phase}$ and frequency difference $\Delta_{freq}$ between $(1/N)F_{vco}$ and $F_{in}$ and for generating a control signal $V_1$ based upon $\Delta_{phase}$ and $\Delta_{freq}$, wherein control signal $V_1$ obtains a value $V_{ref}$ when $\Delta_{phase}$ and $\Delta_{freq}$ are at a zero level, Wherein $V_1-V_{ref}$ is representative of $\Delta_{phase}$ and $\Delta_{freq}$, and wherein a low frequency signal component $V_{low}$ of $V_1-V_{ref}$ is representative of $\Delta_{freq}$.

The system further includes a drive signal source circuit for supplying an oscillator drive signal and a frequency control circuit having an input coupled to an output of the error detector circuit. The frequency control circuit generates a control signal output based upon the signal component $V_{low}$ and is coupled to an input of the drive signal source circuit, wherein the oscillator drive signal is regulated according to the value of the control signal output. The system further including a scaling circuit which scales the frequency control circuit output according to the value N, and a linearized multiplier circuit for modulating the scaled oscillator drive signal. The modulated output is applied as an input to the oscillator. The linearized multiplier circuit is responsive to the value of $V_1-V_{ref}$, whereby the scaled and modulated input to the oscillator serves to adjust the oscillator output $F_{vco}$ to obtain the phase and N times the frequency of $F_{in}$.

In another aspect of the present invention, a method for controlling the frequency and phase of an oscillator output in a phase-locked loop for a multi-band operating system, wherein each band has its own band frequency and is represented by a respective value of a scaling factor, the present value of the scaling factor being designated as N. The loop includes an oscillator circuit for locking onto the frequency of a system input signal, an error detector circuit for receiving the system input signal, a charge pump circuit coupled to the output of the error detector circuit, and an oscillator drive circuit whose input is coupled to the output of the charge pump circuit and whose oscillator drive signal output is coupled to the oscillator input for driving the oscillator output, the oscillator output being coupled to one input of the error detector circuit and the system signal input being applied to another input of the error detector circuit. The error detector circuit issues an error output representative of differences in phase $\Delta_{phase}$ and/or frequency $\Delta_{freq}$ between the oscillator output frequency or a 1/N multiple thereof and the system input signal frequency. The charge pump circuit issues an error signal based upon errors detected by the error detector circuit, the phase and/or frequency of the oscillator output being adjusted by the oscillator drive circuit according to the error signal. The method includes the steps of submitting the error signal to a filter circuit to extract a low frequency component $V_{low}$ expressive of $\Delta_{freq}$, continuously regulating the oscillator drive signal according to the non-zero value of $V_{low}$, and scaling the oscillator drive signal according to the value of N. Preferably the step of scaling the oscillator drive signal according to the value of N includes driving the oscillator to minimize $\Delta_{freq}$. This method may further include the step of modulating the oscillator drive signal according to changes in the error control signal in order to minimize $\Delta_{phase}$.

Other advantages and features will become apparent from the following description of the preferred embodiment and from the claims.

BRIEF DESCRIPTION OF THE DRAWING

The drawings are first briefly described below.

DESCRIPTION OF THE PREFERRED EMBODIMENT

Figure 1:
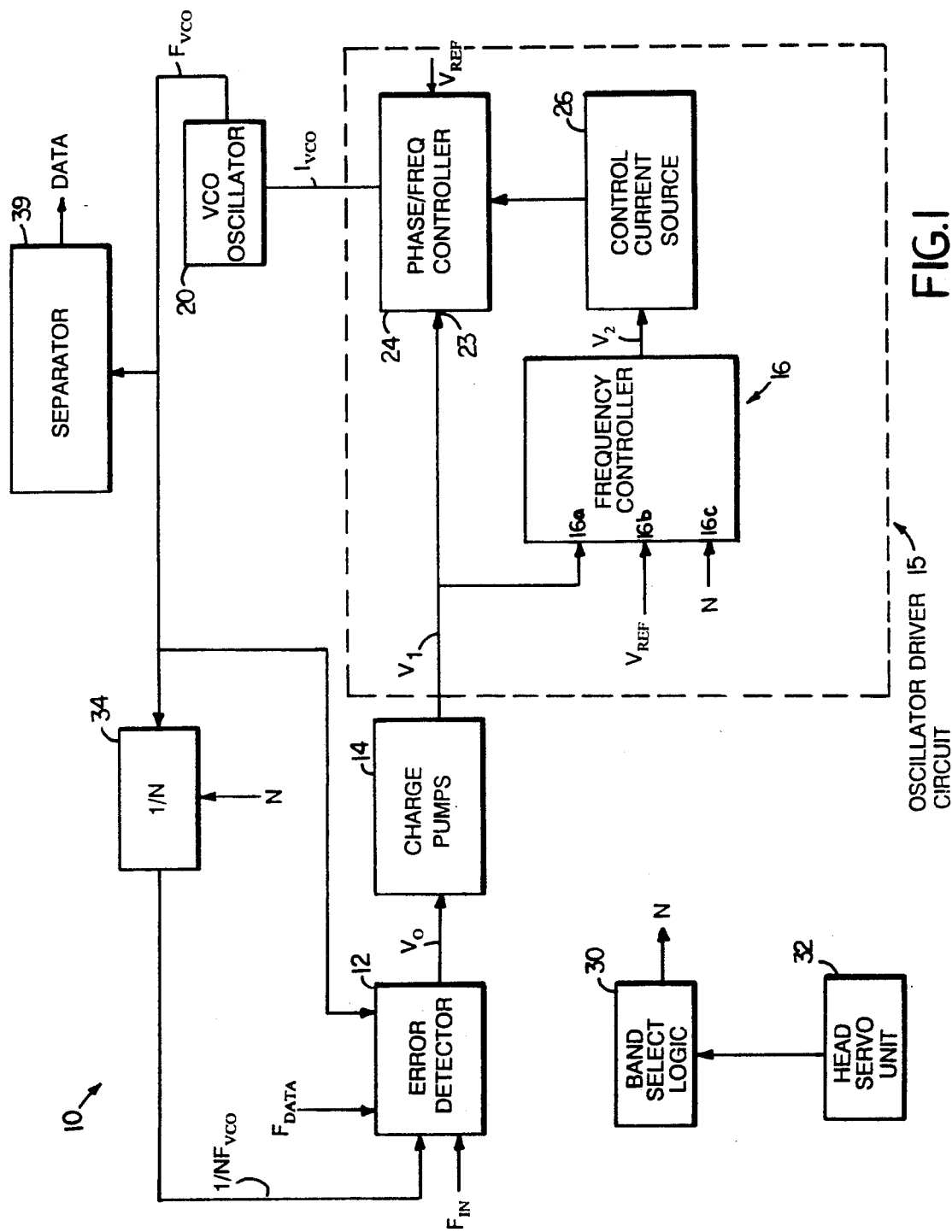
FIG. 1 is a block diagram of a simplified embodiment of the invention.

An illustrative embodiment of the present invention is shown in the simplified block diagram of FIG. 1. Phase-locked loop 10 includes error detector 12, charge pump 14, oscillator driver circuit 15 and oscillator 20 (hereinafter VCO). VCO 20 is preferably a current controlled oscillator.

The VCO is maintained at a given frequency $F_{vco}$ according to a control current $I_{vco}$ supplied to the oscillator by oscillator driver circuit 15. The oscillator driver circuit 15 includes a frequency controller circuit 16, a control current source 26 and a phase and frequency control circuit 24. The output $I_{vco}$ of controller 24 is applied to VCO input 21 to drive the VCO output frequency accordingly.

In this embodiment, the frequency $F_{vco}$ of the VCO 20 is maintained at an N multiple of the frequency $F_{in}$ of a system reference clock input. This system reference clock input is derived relative to or from the rate of disk rotation and is related to the frequency $F_{data}$ at which data is read from the disk.

The system reference clock input $F_{in}$ and a 1/N multiple (via multiplier 34) of the oscillator output $F_{vco}$, i.e., $(1/N)F_{vco}$, respectively, are applied to a first and second input of error detector 12. Any phase difference ($\Delta$phase) or frequency difference ($\Delta$frequency) detected between these input signals by error detector 12 results in an error output signal output $V_o$ which is nonzero. The system data input $F_{data}$, the frequency at which data is actually read from the disk, and the oscillator output $F_{vco}$ are applied to a third and fourth input of error detector 12. Any phase difference ($\Delta$phase) or frequency difference ($\Delta$frequency) between these input signals also results in an error output signal $V_o$ which is non-zero.

This error output signal $V_o$ is applied through a multiplexer 25 to charge pump circuit 14 which generates an error voltage $V_1$ based upon error signal $V_o$. $V_1$ is an analog signal whose average value is related to the frequency error and whose instantaneous value represents both phase and frequency error. The multiplexer 25 is used to select whether the error signal $V_o$ is derived from the system reference clock input $F_{in}$ or the system data input $F_{data}$.

This error voltage $V_1$ is applied to oscillator driver circuit 15 through an input 16a of frequency controller 16 and an input 23 of phase/frequency controller 24. In addition, a system reference voltage $V_{ref}$ is applied on a second input 16b of frequency controller 16. $V_{ref}$ is equal to the d.c. steady-state value of $V_1$ obtained when $V_o$ indicates no error in detector 12, i.e., $V_1$ is equal to $V_{ref}$ when $(1/N)F_{vco}$ is equal to $F_{in}$. Hence, the function of frequency controller 16 and phase/frequency controller 24 is to drive $V_1$ to and maintain $V_1$ at $V_{ref}$. Accordingly, and generally speaking, the output $I_{vco}$ of phase frequency controller 24 represents instantaneous phase and frequency error between $(1/N)F_{vco}$ and $F_{in}$, and the output voltage $V_2$ of frequency controller circuit 16 represents the average frequency error between $(1/N)F_{vco}$ and $F_{in}$.

Preferably, frequency controller 16 is an integrator. The integrator acts as a low-pass filter to error signal $V_1$. Thus, while the integrator is insensitive to transient variances of $V_1$ (i.e., phase error), it is very responsive to the low frequency, low, or steady state changes of $V_1$ (i.e., non-trivial frequency error, such as at band change). The integrator circuit has very high low-frequency gain compared to the phase/frequency controller 24, and therefore dominates the driving of the oscillator to a new frequency following the switching of a band.

Frequency controller 16 also includes a scaling circuit which abruptly scales the output $V_2$ of frequency controller 16 whenever the value of band range select signal N, applied to frequency controller 16 at input 16c, is changed (i.e., at band change). The frequency of the VCO output is thus scaled according to the band range select signal N supplied by band select logic network 30. Band select signal N is derived from system logic otherwise employed in the system to control the location of the read/write head over the data disk via head servo unit 32.

In operation, when data is to be read at a new band location on the data disk, a new data frequency must be acquired by the loop. This frequency is supplied to a data separator 39 to enable extraction of data from the read data signal. Generally speaking, upon selection of a new band frequency, $F_{in}$ is compared by error detector 12 to the appropriate fraction of $F_{vco}$ (via 1/N multiplier 34) according to the new value of N; the error output signal $V_o$ representative of this difference is applied to charge pump 14 to generate error voltage $V_1$. $V_1$ is applied to the phase/frequency controller 24 which varies $I_{vco}$ to begin the frequency adjustment of $F_{vco}$. $V_1$ is also applied to the frequency controller 16; and the average or low frequency difference between $V_1$ and $V_{ref}$, represented by the output $V_2$ of frequency controller 16 is scaled abruptly at band change according to the change in the applied control signal N. The output of the frequency controller 16, $V_2$, in turn is applied to control current source 26. The output of the control current source 26 is used to adjust the output $I_{vco}$ of phase/frequency controller 24. The adjusted $I_{vco}$ is therefore modulated by phase/frequency controller 24, and controls the frequency of the VCO. When $(1/N)F_{vco}$ is at $F_{in}$, then the steady state value of $V_1$ will be at $V_{ref}$, and the output $V_2$ of frequency controller 16 Will remain at the most recent level to which it has been driven. Likewise $I_{vco}$ will remain at its level except for instantaneous error adjustments (such as for phase differences) made by phase/frequency controller 24 as a result of the transient components of $V_1$. Therefore, when $V_1$ is at $V_{ref}$, the frequency of the VCO will be at N times the frequency of $F_{in}$, and the two frequencies will be in phase.

The VCO is now approximately set at the frequency of the read data now intended to be read and decoded. This presetting enables the loop to acquire the actual data frequency with great speed, as is necessary in high speed processing systems, without overburdening the charge pumps 14 because the charge pumps are essentially relieved of much of the burden of driving the VCO 20 to a new band frequency.

Figure 2:
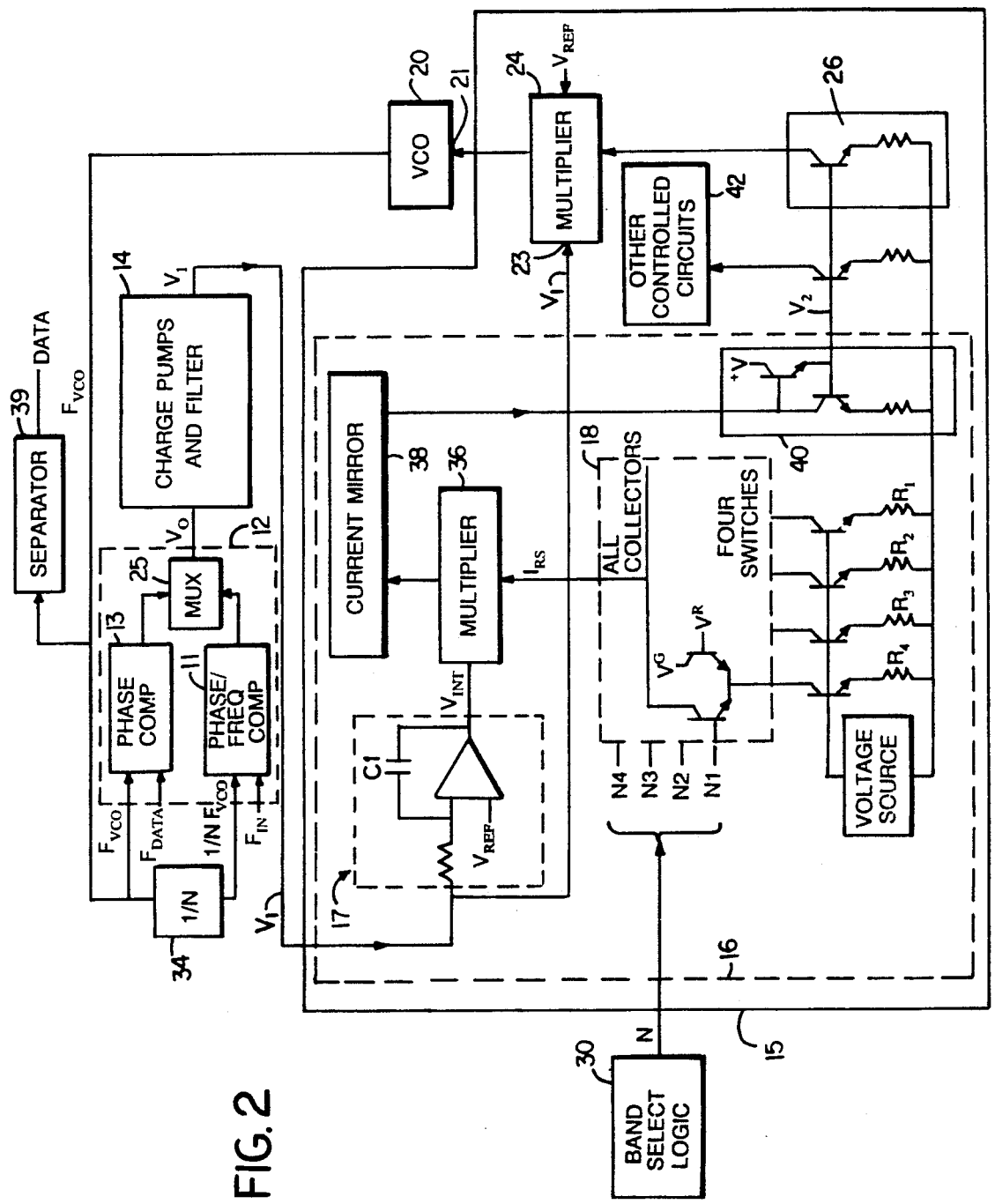
FIG. 2 is a block/schematic diagram of a preferred embodiment of the invention.

Turning now to the preferred embodiment of FIG. 2, the function of error detector 12 is served by phase/frequency comparator 11 and phase comparator 13. $F_{vco}$ is applied to a first input of phase comparator 13 and $(1/N)F_{vco}$ is applied to a first input of phase/frequency comparator 11 from 1/N multiplier 34. The system reference clock input $F_{in}$ is applied to a second input of phase/frequency comparator 11 and the system data input $F_{data}$, the actual frequency at which data will be read from the disk, is applied to a second input of phase comparator 13.

The output signals from both comparators 11, 13 are multiplexed by multiplexer 25. As stated previously, the multiplexer 25 selects whether the error signal $V_o$ is to be generated by $F_{in}$ or $F_{data}$. The multiplexer output $V_o$, which is representative of the error detected by the selected one of comparators 11, 13, is applied to a combination charge pump/filter circuit 14. The output $V_1$ of the charge pump filter circuit 14 is the input to the oscillator driver circuit 15 through the frequency controller circuit 16. Preferably, frequency controller circuit 16 (now demarcated in dotted outline) includes an integrator circuit 17. $V_{ref}$ is applied to the non-inverting input of integrator 17 and $V_1$ is resistively coupled to the integrator's inverting input. Capacitor C1 is coupled between the integrator's output and inverting input and charges to the level required to drive $F_{vco}$ to $NF_{in}$. Thus, when $F_{vco}$ is at $NF_{in}$, $V_1$ ideally will be at $V_{ref}$ and the charge on capacitor C1 will remain at the present value and so maintain the VCO at its output frequency equal to $NF_{in}$.

The output signal $V_2$ of frequency controller circuit 16 is derived from the output $V_{int}$ of the integrator 17. $V_2$ is generated by applying $V_{int}$ through a linearized multiplier 36, to a current mirror 38 and a current mirror 40. The mirrors 38, 40 are for level shifting and are conventional. Linearized multiplier 36 multiplies the output $V_{int}$ of the integrator according to a range select current $I_{RS}$ established by a band range select circuit 18 based on the present value of N. Band range select circuit 18 is a conventional D/A converter, with n gated switches each controlled by the binary state of a different one of the bits in the n-bit value of N. Hence, the value of N determines the value of $I_{RS}$ by switching the fixed current sources R1-R4 so as to direct current from the individual source through the mirrors 38, 40. The $V_2$ output is used to drive control current source 26. The output of control current source 26 is then used to drive the frequency of the VCO 20 via the output $I_{vco}$ of phase and frequency controller circuit 24. Preferably controller circuit 24 is a linearized multiplier circuit, where $I_{vco}$ is multiplied by the error in $V_1$ (i.e., $V_1-V_{ref}$). The frequency of the VCO Output is thus scaled by band range select circuit 18 according to band select signal N from band select logic network 30.

The output $V_2$ optionally may be supplied for use by other timing circuits 42 such as delay lines, as required by an individual application. The input to these circuits are thus scaled as may be useful or required in a data separation environment.

As a benefit of the present invention, the charge pumps 14 are able to operate near their optimum level, which is centered about $V_{ref}$. When N is switched, the band range select circuit 18 immediately scales $V_2$ to cause the VCO frequency to jump close to the desired new value. The charge pump output $V_1$ is driven away from $V_{ref}$, and this error immediately modulates $I_{vco}$ via the phase/frequency controller 24 to quickly obtain the desired phase and frequency. The low speed adjustment via the integrator 17 and the multiplier 36 then adjusts $I_{vco}$ causing $V_1$ to recover to the optimum value $V_{ref}$ with the VCO 20 operating at the correct frequency of an N multiple of $F_{in}$.

With the VCO 20 oscillating at an N multiple of $F_{in}$ (i.e. the VCO is at the frequency of the next expected system data input), multiplexer 25 switches the loop input from the fixed frequency clock input $F_{in}$ to the real time system data input $F_{data}$ as applied to comparator 13 thereby by-passing 1/N multiplier circuit 34. The loop now detects frequency and phase errors and the charge pumps adjust the VCO with little effort via phase/frequency controller 24, while the VCO is held at the new band frequency range by the interaction of integrator 17 and range select circuit 18. The VCO output is now maintained at the frequency of and in phase with the data input, thus enabling data separator circuit 39 once again to extract the digital data from the system input $F_{data}$.

Other embodiments are within the following claims. What is claimed is:

1. A system having a phase-locked loop, the loop comprising an oscillator, a multi-input error detector circuit and an oscillator drive circuit, the loop being switchable between various ones of a plurality of preset operating frequencies wherein each one of the preset frequencies is represented with a respective scaling value and wherein a current scaling value is represented as N, a 1/N multiplier circuit coupled to the oscillator output, the scaling value N being applied to the 1/N multiplier circuit, a 1/N multiple of the oscillator output frequency being supplied by the 1/N multiplier circuit to the error detector circuit as $(1/N)F_{vco}$, the error detector circuit having a second input for receiving an applied input signal, $(1/N)F_{vco}$ being compared in the error detector circuit to the frequency $F_{in}$ of the applied input signal, the error detector circuit generating an output $V_1$ representative of phase and frequency error between $F_{in}$ and $(1/N)F_{vco}$, where $V_1$ is equal to a fixed value $V_{ref}$ when there is no phase or frequency error between $F_{in}$ and $(1/N)F_{vco}$, and the oscillator drive circuit including an oscillator drive signal source circuit coupled to and for supplying a drive signal to an input of the oscillator, a low pass filter/driver circuit for receiving $V_1$ and $V_{ref}$ and for detecting a low frequency error component $V_{low}$ of $V_1$ when $V_1$ does not equal $V_{ref}$, $V_{low}$ representing the error in frequency between $F_{in}$ and $(1/N)F_{vco}$, the low pass filter/driver circuit generating a control signal $V_2$ that represents $V_{low}$, said oscillator drive signal source circuit including circuitry for combining $V_1$ and $V_2$ to generate said drive signal thereby to adjust the oscillator until $(1/N)F_{vco}$ is essentially at $F_{in}$ and at least $V_{low}$ is essentially at zero.

2. The system of claim 1 further comprising a band range select circuit coupled to the low pass filter/driver circuit for scaling the control signal $V_2$ according to the scaling value N.

3. The system of claim 2 wherein the band range select circuit comprises a binary gated switch circuit.

4. The system of claim 1 further comprising a phase and frequency control circuit responsive to the difference between $V_1$ and $V_{ref}$ and coupled between the output of the low pass filter/driver circuit and the oscillator input, the phase and frequency control circuit adjusting the drive signal output of the oscillator drive signal source circuit before the drive signal is inputted to the oscillator, the thus adjusted drive signal causing $F_{in}$ to be driven to be equal to and in phase with $1/NF_{vco}$.

5. The system of claim 2 wherein the oscillator drive circuit includes a range multiplier circuit having an input for receipt of the band range select output, wherein the low pass filter/driver circuit output is multiplied by the value of the band range select circuit output to generate control signal $V_2$.

6. The system of claim 1 wherein the filter/driver circuit includes an integrator circuit.

7. The system of claim 6 further comprising a band range select circuit coupled to the low pass filter/driver circuit for scaling the control signal $V_2$ according to the scaling value N.

8. A system having a phase-locked loop, the loop comprising an oscillator, a multi-input error detector circuit and an oscillator drive circuit, the loop being switchable between various ones of a plurality of preset operating frequencies wherein each one of the preset frequencies is represented with a respective scaling value and wherein a current scaling value is represented as N, a 1/N multiplier circuit coupled to the oscillator output, the scaling value N being applied to the 1/N multiplier circuit, a 1/N multiple of the oscillator output frequency being supplied by the 1/N multiplier circuit to the error detector circuit as $(1/N)F_{vco}$, the error detector circuit having a second input for receiving an applied input signal, $(1/N)F_{vco}$ being compared in the error detector circuit to the frequency $F_{in}$ of the applied input signal, the error detector circuit generating an output $V_1$ representative of phase and/or frequency error between $F_{in}$ and $(1/N)F_{vco}$, where $V_1$ is equal to a fixed value $V_{ref}$ when there is no phase or frequency error between $F_{in}$ and $(1/N)F_{vco}$, and the oscillator drive circuit including an oscillator drive signal source circuit coupled to and for supplying a drive signal to an input of the oscillator, a low pass filter/driver circuit for receiving $V_1$ and $V_{ref}$ and for detecting a low frequency error component $V_{low}$ of $V_1$ when $V_1$ does not equal $V_{ref}$, $V_{low}$ representing the error in frequency between $F_{in}$ and $(1/N)F_{vco}$, the low pass filter/driver circuit generating a control signal $V_2$ to an input of the oscillator drive signal source circuit for continuously adjusting the drive signal according to control signal $V_2$ for driving the oscillator until $(1/N)F_{vco}$ is essentially at $F_{in}$ and $V_{low}$ is essentially at zero, and a linearized multiplier circuit responsive to the difference between $V_1$ and $V_{ref}$ and coupled between the output of the oscillator drive signal source circuit and the oscillator input, the linearized multiplier circuit adjusting the drive signal output of the oscillator drive signal source circuit before the drive signal is inputted to the oscillator, the thus adjusted drive signal causing $F_{in}$ to be driven to be equal to and in phase with $(1/N)F_{vco}$.

9. A system having a phase-locked loop, the loop comprising an oscillator, a multi-input error detector circuit and an oscillator drive circuit, the loop being switchable between various ones of a plurality of preset operating frequencies wherein each of the preset frequencies is represented with a respective scaling value and wherein a current scaling value is represented as N, a 1/N multiplier circuit coupled to the oscillator output, the scaling value N being applied to the 1/N multiplier circuit, a 1/N multiple of the oscillator output frequency being supplied by the 1/N multiplier circuit to the error detector circuit as $(1/N)F_{vco}$, the error detector circuit having a second input for receiving an applied input signal, $(1/N)F_{vco}$ being compared in the error detector circuit to the frequency $F_{in}$ of the applied input signal, the error detector circuit generating an output $V_1$ representative of phase and/or frequency error between $F_{in}$ and $(1/N)F_{vco}$, where $V_1$ is equal to a fixed value $V_{ref}$ when there is no phase or frequency error between $F_{in}$ and $(1/N)F_{vco}$, the oscillator drive circuit including an oscillator drive signal source circuit coupled to and for supplying a drive signal to an input of the oscillator, and a low pass filter/driver circuit for receiving $V_1$ and $V_{ref}$ and for detecting a low frequency error component $V_{low}$ of $V_1$ when $V_1$ does not equal $V_{ref}$, $V_{low}$ representing the error in frequency between $F_{in}$ and $(1/N)F_{vco}$, the low pass filter/drive circuit generating a control signal $V_2$ to an input of the oscillator drive signal source circuit for continuously adjusting the drive signal according to control signal $V_2$ for driving the oscillator until $(1/N)F_{vco}$ is essentially at $F_{in}$ and $V_{low}$ is essentially at zero, wherein the oscillator drive signal source circuit comprises a voltage controlled current source circuit, the low pass filter/driver circuit includes an integrator circuit, and $V_1$ and $V_{ref}$ are applied to the integrator and the integrator output is applied to the oscillator drive signal source circuit.

10. The system of claim 9 wherein the integrator includes a resistive input for receipt of $V_1$ and a second input for receipt of $V_{ref}$, the integrator output being coupled to the integrator's resistive input via a capacitor, wherein $1/NF_{vco}$ is held at $F_{in}$ by the charge on the capacitor when $V_1$ is equal to $V_{ref}$.

11. A system having a phase-locked loop, the loop comprising an oscillator, a multi-input error detector circuit and an oscillator drive circuit, the loop being switchable between various ones of a plurality of preset operating frequencies wherein each one of the preset frequencies is represented with a respective scaling value and wherein a current scaling value is represented as N, a 1/N multiplier circuit coupled to the oscillator output, the scaling value N being applied to the 1/N multiplier circuit, a 1/N multiple of the oscillator output frequency being supplied by the 1/N multiplier circuit to the error detector circuit as $(1/N)F_{vco}$, the error detector circuit having a second input for receiving an applied input signal, $(1/N)F_{vco}$ being compared in the error detector circuit to the frequency $F_{in}$ of the applied input signal, the errors detector circuit generating an output $V_1$ representative of phase and/or frequency error between $F_{in}$ and $(1/N)F_{vco}$, where $V_1$ is equal to a fixed value $V_{ref}$ when there is no phase or frequency error between $F_{in}$ and $(1/N)F_{vco}$, the oscillator drive circuit including an oscillator drive signal source circuit coupled to and for supplying a drive signal to an input of the oscillator, and a low pass filter/driver circuit for receiving $V_1$ and $V_{ref}$ and for detecting a low frequency error component $V_{low}$ of $V_1$ when $V_1$ does not equal $V_{ref}$, $V_{low}$ representing the error in frequency between $F_{in}$ and $(1/N)F_{vco}$, the low pass filter/drive circuit generating a control signal $V_2$ to an input of the oscillator drive signal source circuit for continuously adjusting the drive signal according to control signal $V_2$ for driving the oscillator until $(1/N)F_{vco}$ is essentially at $F_{in}$ and $V_{low}$ is essentially at zero, a band range select circuit coupled to the low pass filter/driver circuit for scaling the control signal $V_2$ according to the scaling value N, wherein the low pass filter/driver circuit includes an integrator and the oscillator drive circuit includes a range multiplier circuit having a first input for receipt of the integrator output and a second input for receipt of the band range select output, said range multiplier circuit multiplying the integrator output by the value of the band range select circuit output to generate control signal $V_2$.

12. The system of claim 11 wherein the band range select circuit comprises a binary gated switch circuit.

13. The system of claim 11 further comprising a pair of voltage level shifting current mirrors wherein the output of the range multiplier circuit is coupled to the oscillator drive signal source via the current mirrors.

14. A system having a phase-locked loop, the loop comprising an oscillator, a multi-input error detector circuit and an oscillator drive circuit, the loop being switchable between various ones of a plurality of preset operating frequencies wherein each one of the preset frequencies is represented with a respective scaling value and wherein a current scaling value is represented as N, a 1/N multiplier circuit coupled to the oscillator output, the scaling value N being applied to the 1/N multiplier circuit, a 1/N multiple of the oscillator output frequency being supplied by the 1/N multiplier circuit to the error detector circuit as $(1/N)F_{vco}$, the error detector circuit having a second input for receiving an applied input signal, $(1/N)F_{vco}$ being compared in the error detector circuit to the frequency $F_{in}$ of the applied input signal, the error detector circuit generating an output $V_1$ representative of phase and/or frequency error between $F_{in}$ and $(1/N)F_{vco}$, where $V_1$ is equal to a fixed value $V_{ref}$ when there is no phase or frequency error between $F_{in}$ and $(1/N)F_{vco}$, the oscillator drive circuit including an oscillator drive signal source circuit coupled to and for supplying a drive signal to an input of the oscillator, and a low pass filter/driver circuit for receiving $V_1$ and $V_{ref}$ and for detecting a low frequency error component $V_{low}$ of $V_1$ when $V_1$ does not equal $V_{ref}$, $V_{low}$ representing the error in frequency between $F_{in}$ and $(1/N)F_{vco}$, the low pass filter/driver circuit generating a control signal $V_2$ to an input of the oscillator drive signal source circuit for continuously adjusting the drive signal according to control signal $V_2$ for driving the oscillator until $(1/N)F_{vco}$ is essentially at $F_{in}$ and $V_{low}$ is essentially at zero, wherein the multi-input error detector circuit includes a frequency comparator circuit, a phase and frequency comparator circuit, a multiplexer circuit and a charge pump/filter circuit, and the respective outputs of the comparators are selectively coupled to the charge pump/filter circuit via the multiplexer circuit.

15. The system of claim 14 wherein the multiplexer circuit applies the output of the frequency comparator to the charge pump/filter circuit when the loop is switched from one to another of the plurality of preset frequencies.

16. A computer system having a phase-locked loop comprising (1) a current controlled oscillator, the loop capable of acquiring one of a plurality of preset operating frequencies for use in a system (a) which represents each of the preset frequencies with a respective value of a scaling factor, a current value of the scaling factor being designated as N, and (b) which supplies a preset reference clock signal at a fixed frequency $F_{in}$ to the loop, the oscillator circuit having an output capable of being driven to a frequency $F_{vco}$ which is N times the frequency of $F_{in}$, (2) an error detector circuit for detecting the phase difference $\Delta_{phase}$ and frequency difference $\Delta_{freq}$ between $(1/N) F_{vco}$ and $F_{in}$ and for generating a control signal $V_1$ based upon $\Delta_{phase}$ and $\Delta_{freq}$, wherein control signal $V_1$ obtains a value $V_{ref}$ when $\Delta_{phase}$ and $\Delta_{freq}$ are at a zero level, wherein $V_1 - V_{ref}$ is representative of $\Delta_{phase}$ and $\Delta_{freq}$, and wherein a low frequency signal component $V_{low}$ of $V_1 - V_{ref}$ is representative of $\Delta_{freq}$.

(3) a drive signal source circuit for supplying an oscillator drive signal, (4) a frequency control circuit having an input coupled to an output of the error detector circuit, the frequency control circuit generating a control signal output based upon the signal component $V_{low}$ and coupled to an input of the drive signal source circuit, wherein the oscillator drive signal is regulated according to the value of the control signal output, (5) a scaling circuit which scales the frequency control circuit output according to the value N, and (6) a linearized multiplier circuit for modulating the scaled oscillator drive signal and whose output is applied as an input to the oscillator, the linearized multiplier circuit responsive to the value of $V_1 - V_{ref}$, whereby the scaled and modulated input to the oscillator serves to adjust the oscillator output to obtain the phase and N times the frequency of $F_{in}$.

17. A method for controlling the frequency and phase of an oscillator output in a phase-locked loop for a multi-band operating system wherein each band has its own band frequency and is represented by a respective value of a scaling factor, the current value of the scaling factor being designated as N, in a loop comprising an oscillator circuit for locking onto the frequency of a system input signal, an error detector circuit for receiving the system input signal, a charge pump circuit coupled to the output of the error detector circuit, and an oscillator drive circuit having an input coupled to the output of the charge pump circuit and producing an oscillator drive control signal that coupled to the oscillator input for driving the oscillator output, the oscillator output being coupled to one input of the error detector circuit and the system signal input being applied to another input of the error detector circuit, the error detector circuit issuing an error output representative of differences in phase $\Delta_{phase}$ and frequency $\Delta_{freq}$ between the oscillator output frequency or a 1/N multiple thereof and the system input signal frequency, the charge pump circuit issuing an error signal that represents $\Delta_{freq}$ and $\Delta_{phase}$ based upon said error output, said oscillator drive circuit producing said oscillator drive control signal to adjust the phase and frequency of the oscillator output, the method comprising the steps of submitting the error signal to a filter circuit to extract a low frequency component $V_{low}$ expressive of $\Delta_{freq}$, scaling $V_{low}$ according to the value of N to develop a scaled $V_{low}$ that is capable of minimizing $\Delta_{freq}$, and combining the error signal with said scaled $V_{low}$ to produce said oscillator drive control signal capable of adjusting the oscillator to minimize $\Delta_{freq}$ and $\Delta_{phase}$.

18. A multi-frequency operating system having a phase-locked loop for controlling an output frequency of an oscillator and driving said output frequency to a selected one of a set of frequency bands, said loop comprising circuitry for detecting phase and frequency errors between said oscillator output frequency and a reference frequency and producing a first error signal that represents said phase and frequency errors, said first error signal being equal to a reference level in the absence of said phase and frequency errors, circuitry for generating a second error signal in response to low frequency differences between said first error signal and said reference level, said second error signal representing an average of said frequency errors, and a controller for combining said first error signal and said second error signal to generate a drive signal and applying said drive signal to cause said oscillator to adjust said output to minimize said phase and frequency errors, said controller including circuitry for scaling said second error signal in response to a change in the selected frequency band before said combining to correspondingly change a relative contribution of said second error signal with respect to said first error signal in said drive signal during changes in said selected frequency band.

* * * * *

UNITED STATES PATENT AND TRADEMARK OFFICE
CERTIFICATE OF CORRECTION

PATENT NO.    : 5,119,043

DATED         : June 2, 1992

INVENTOR(S)   : Russell W. Brown et al.

It is certified that error appears in the above-identified patent and that said Letters Patent is hereby corrected as shown below:

On the title page, Item [75]:

"Borwn et al." should read --Brown et al.--.

"Russell W. Borwn" should read --Russell W. Brown--.

Column 2, line 2, insert --.-- after "error".

Column 2, line 66, "Wherein" should read --wherein--.

Column 6, line 13, "Will" should read --will--.

Column 6, line 41, "previous)y," should read --previously--.

Column 7, line 13, "Output" should read --output--.

Signed and Sealed this

Twelfth Day of October, 1993

Attest:

BRUCE LEHMAN

*Attesting Officer*    Commissioner of Patents and Trademarks